(12) United States Patent
Rueb

(10) Patent No.: US 7,687,843 B2
(45) Date of Patent: Mar. 30, 2010

(54) PROCESS FOR PATTERNING CAPACITOR STRUCTURES IN SEMICONDUCTOR TRENCHES

(75) Inventor: Michael Rueb, Faak am See (AT)

(73) Assignee: Infineon Technologies AG, Munich (DE)

( * ) Notice: Subject to any disclaimer, the term of this patent is extended or adjusted under 35 U.S.C. 154(b) by 300 days.

(21) Appl. No.: 11/270,282

(22) Filed: Nov. 9, 2005

(65) Prior Publication Data

US 2006/0118852 A1 Jun. 8, 2006

(30) Foreign Application Priority Data

Nov. 9, 2004 (DE) ........................ 10 2004 054 352

(51) Int. Cl.
  *H01L 27/108* (2006.01)
(52) U.S. Cl. ..................... 257/301; 257/303; 257/304; 257/305; 257/309; 257/E27.092; 438/243
(58) Field of Classification Search ................. 257/301, 257/E27.092, 303–305, 309; 438/243
See application file for complete search history.

(56) References Cited

U.S. PATENT DOCUMENTS

| | | | | |
|---|---|---|---|---|
| 4,673,962 A | * | 6/1987 | Chatterjee et al. ............. | 257/68 |
| 4,871,688 A | * | 10/1989 | Lowrey ........................ | 438/252 |
| 4,905,065 A | * | 2/1990 | Selcuk et al. ................ | 257/301 |
| 5,394,000 A | * | 2/1995 | Ellul et al. .................. | 257/301 |
| 5,593,908 A | | 1/1997 | Jovanovic et al. ............. | 437/40 |
| 6,552,382 B1 | * | 4/2003 | Wu ............................ | 257/305 |
| 6,573,558 B2 | * | 6/2003 | Disney ........................ | 257/328 |
| 6,608,350 B2 | | 8/2003 | Kinzer et al. ................ | 257/341 |
| 6,723,611 B2 | | 4/2004 | Akatsu et al. ................ | 438/386 |
| 2003/0016569 A1 | * | 1/2003 | Dahl et al. ................... | 365/200 |

* cited by examiner

*Primary Examiner*—Matthew E Warren
*Assistant Examiner*—John Lin
(74) *Attorney, Agent, or Firm*—Coats & Bennett, P.L.L.C.

(57) ABSTRACT

A process for producing structures in a semiconductor zone, has the steps of a) producing a trench (2) in the semiconductor zone (18), b) filling the trench with a photoresist (19), and c) exposing the photoresist (19) using ion beams (20), d) developing the photoresist (19). The energy density and ion dose for the ion beams (20) are selected in such a way that the photoresist (19) is only chemically changed at defined depths, so as to produce two regions, in the first region (21) of which the photoresist has been chemically changed at the defined depths by the ion beams (20), and in the second region of which the photoresist has been left chemically unchanged, so that during the developing step the photoresist is removed in precisely one of the two regions.

14 Claims, 7 Drawing Sheets

US 7,687,843 B2

PROCESS FOR PATTERNING CAPACITOR STRUCTURES IN SEMICONDUCTOR TRENCHES

CROSS-REFERENCE TO RELATED APPLICATIONS

This application claims priority from German Patent Application No. 10 2004 054 352.6, which was filed on Nov. 9, 2004, and is incorporated herein by reference in its entirety.

TECHNICAL FIELD

The invention relates to a capacitor structure in trench structures of semiconductor components, to semi-conductor components comprising capacitor structures of this type, and to a process for patterning semiconductor components.

BACKGROUND

In conventional MOSFETs, the maximum donor concentration $[N_D]$ in an n⁻-type zone and therefore also the electrical conductivity of the n⁻-type zone are determined by the required blocking capability. In the event of an avalanche breakdown, approximately $1.5 \times 10^{12}$ cm⁻² donors are then ionized, the countercharge of which is found in the acceptor charge of the p-conducting zone of the MOSFET structure. If a higher donor concentration is to be made possible, countercharges for the donor atoms of the n⁻-type zone have to be found approximately in the same component plane. In the case of MOS field plate transistors comprising a trench structure, as are known from document U.S. Pat. No. 6,573,558 B2, this is effected by means of the charge carriers of the field plate. In the case of compensation components, such as in the case of "CoolMOS", which have n⁻-type zones and p-type zones arranged alternately in cells, this is done by means of acceptors of the p-type zones as countercharges.

In this context, an n⁻-type or p⁻-type zone is to be understood as meaning a region of a semiconductor component which is lightly doped and has a defect concentration $[N_D]$ or $[N_P]$, respectively, of between $$1 \times 10^{12} \text{ cm}^{-3} \leq ([N_D] \text{ or } [N_P]) \leq 1 \times 10^{17} \text{ cm}^{-3}$$

where $[N_D]$ is the donor concentration and $[N_P]$ is the acceptor concentration.

An n-type or p-type zone is to be understood as meaning a region of a semiconductor component which is medium-doped and has a defect concentration of between $$1 \times 10^{17} \text{ cm}^{-3} \leq ([N_D] \text{ or } [N_P]) \leq 1 \times 10^{18} \text{ cm}^{-3}.$$

An n⁺-type or p⁺-type zone is to be understood as meaning a region of a semiconductor component which is highly doped and has a defect concentration of between $$1 \times 10^{18} \text{ cm}^{-3} \leq ([N_D] \text{ or } [N_P]) \leq 1 \times 10^{20} \text{ cm}^{-3}.$$

A metallically conducting semiconductor zone is to be understood as meaning a region of a semiconductor component which has an extremely high doping and has a defect concentration of between $$1 \times 10^{20} \text{ cm}^{-3} \leq ([N_D] \text{ or } [N_P]) \leq 1 \times 10^{22} \text{ cm}^{-3}.$$

If the intention is to further improve the electrical conductivity of an n⁻-type zone in compensation components, such as for example "CoolMOS", in comparison with the prior art, the degree of compensation has to be set more and more accurately. Even nowadays, this is encountering the limits of technological feasibility. The MOS field plate transistors comprising a trench structure which are known from U.S. Pat. No. 6,73,558 B2 have the disadvantage that, depending on the type of connection of the field plate, the entire reverse voltage is dropped either at the source end or at the drain end with respect to the n⁻-type zone, and therefore very thick insulation layers are required. At a continuous loading of 600 V, approximately 6 μm thick $SiO_2$ would be required, which significantly reduces the effect of the field plate in providing countercharges.

Further semiconductor components comprising trench structures are known from document U.S. Pat. No. 6,608,350 B2. With trench structures of this type, it is possible to fabricate a high-voltage transistor having a low forward resistance with a lightly doped semiconductor body region on an n⁺-conducting semiconductor substrate as a result of the trench structure in the lightly doped semiconductor body region, on the top side of the transistors, being completely filled with a dielectric which has a high relative permittivity $\epsilon_r$.

Instead of a more precise compensation in the case of "CoolMOS", the patent applications DE 10 2004 007 197.7 and DE 10 2004 007 196.9 proposed that the counter-charge be provided by means of a trench capacitor having a significantly higher capacitance than the surrounding Si. To create technically or economically attractive use options, the relative permittivity of the insulator with which the trench in the Si is filled would have to be approximately $\epsilon_r \approx 1000$. Given typical trench widths and widths of the n⁻-type zone in the region of a few μm, on resistance values that are at least a factor of 3 better than in the case of "CoolMOS" at present can be achieved for 600 V components.

Patent application DE 10 2004 044 619.9 discloses a capacitor structure in which the dielectric contains the oxide of the metal of the conducting regions. The stack is produced by multiple application of the metal in each case followed by oxide. However, this process requires a large number of process steps, and consequently there is a high risk of incorrect processing.

SUMMARY

The invention is based on the object of providing a capacitor structure with a high capacitance in a trench in a semiconductor component. A further object of the invention is to provide a process for patterning semiconductor components.

This object can be achieved by a capacitor structure in trench structures of semiconductor components, comprising islands of conductive regions composed of metallic and/or semiconducting materials and/or conductive metal compounds thereof, wherein the islands of conductive regions are being stacked above one another, respectively at at least two opposite side walls of a trench structure, inner walls of the trench structure (2) having an insulation coating, by which the islands of conductive regions are electrically insulated from the inner walls, and regions between islands positioned above one another being filled with insulating and dielectric material.

The center of the trench can be filled with imide or oxide. The material of the regions between the islands may have a higher relative permittivity than silicon dioxide. The thicknesses of the conductive regions and/or of the regions between the islands may vary according to a predetermined potential distribution. The insulation coating may contain $SiO_2$ and/or $Si_3N_4$. The capacitor structure can be embedded in a lightly doped semiconductor body region of one conduction type, the lightly doped semiconductor body region being arranged on a highly doped substrate of the same or opposite conduction type. The thickness of the lightly doped semiconductor body region can be greater than the depth of the trench structure in which the capacitor structure is arranged, so that a buffer layer, which comprises lightly doped semiconductor material of one conduction type, is arranged between capacitor structure and highly doped substrate. A semiconductor component may comprise such a capacitor structure. The semiconductor component can be a Schottky diode, a PN or NP diode, a MOS power transistor or an IGBT power transistor.

The object can also be achieved by a process for producing structures in a semiconductor zone, comprising the steps of producing a trench in the semiconductor zone, filling the trench with a photoresist, exposing the photoresist using ion beams, and developing the photoresist, in which process the ion type, energy density and ion dose for the ion beams are selected in such a way that the photoresist is only chemically changed at defined depths, so as to produce two regions, in the first region of which the photoresist has been chemically changed at the defined depths by the ion beams, and in the second region of which the photoresist has been left chemically unchanged, so that during the developing step the photoresist is removed in precisely one of the two regions.

The energy density, ion type and ion dose can be selected in such a way that the top edge of the region in which the photoresist is removed during the developing step lies below the top edge of the trench. The exposing using ion beams can be divided into a plurality of exposure steps, the exposure steps differing in terms of ion type, energy density and ion dose, so that the first region includes zones of different depths. Each exposure step can be followed by a developing step. The photoresist can be sensitive both to ion radiation and to one of the conventional exposures, light, electrons or X-radiation, after the step of filling the trench with photoresist, a step of applying a hard mask to the semiconductor zone and the photoresist can be carried out, wherein the hard mask may have openings for exposing the zones which lie below the openings, and after the step of exposing using ion beams, a step of exposing using conventional exposure, in particular by means of light, X-radiation or electrons, can be carried out, and in the zones of the first region, the photoresist may have been chemically changed by the ion beams or by the conventional exposure. After the trench has been produced and before it is filled with photoresist, a sacrificial layer can be applied to the inner sides of the trench, and after the step of developing the photoresist, the sacrificial layer can be wet-chemically patterned where the photoresist has been removed. The process may further comprise the steps of: before filling the trench with photoresist, the step of applying a layer sequence made up of oxide, metal and a masking layer to the inner sides of the trench, after the developing of the photoresist, selectively removing the masking layer at the locations which are not covered by photoresist, removing the metal at the locations at which the masking layer has been removed, removing the hard mask and the masking layer, and depositing a dielectric material in the trench. After the dielectric material has been deposited, in a further step an oxide or imide can be deposited in the center of the trench.

The invention provides a capacitor structure which has been introduced into trench structures of semiconductor components. The trenches have an insulation coating at the inner walls; this insulation coating may consist, for example, of silicon oxide. Furthermore, conductive regions, which comprise metallic and/or semiconducting materials and/or conductive metal compounds thereof, are present in the trenches. These conductive regions form islands that are separate from one another and are stacked above one another. A stack of islands of this type is arranged at each of at least two opposite side walls. The islands are separated from the inner sides by the insulation coating. Insulating material which is dielectric is located between the islands located above one another. Overall, the capacitor structure has a higher capacitance than a capacitor in a trench of the same size filled only with the material of the region between the islands would have.

It is therefore possible to achieve a high effective relative permittivity $\epsilon_{reff}$, especially since the effective relative permittivity includes the relative permittivity of the insulator multiplied by a factor derived from the ratio of the trench depth Tg to the sum of the thicknesses $d_i$ of all the insulation layers between the islands in the trench. Accordingly, if the trench is 10 micrometers deep, for an $\epsilon_r$ of approximately 4, as is the case for example with silicon dioxide, the result is a sum of the thicknesses $\Sigma d_i$ of all the insulation layers located above one another of just 40 nanometers if an effective permittivity of 1000 is to be achieved, but this leads to a low breakdown voltage. It is more favorable if an effective permittivity of only 200 is desired. This gives a thickness of 400 nm for the sum of the thicknesses $d_i$ of the dielectric regions between the islands.

If the center of the trench is filled with an imide or oxide, this has the resulting advantage that during processing it is impossible for any moisture to penetrate into the region which has been left clear by the islands and the dielectric.

The capacitance of the capacitor structure rises if the material of the region between the islands has a relative permittivity which is higher than 3.9, which is the relative permittivity of silicon oxide. Suitable materials include silicon nitride ($Si_3N_4$), titanium dioxide ($TiO_2$), tantalum oxide ($Ta_2O_5$), aluminum oxide ($Al_2O_3$) or aluminum nitride (AlN) or mixtures thereof.

In a further preferred embodiment of the invention, the thickness $d_m$ of the conductive regions in the stack can be varied according to a predetermined potential distribution. If high field strengths are required in the adjoining semiconductor material, the insulation layers between the islands, taking account of the permissible breakdown field strength, can have a reduced thickness $d_i$, whereas if lower field strengths are required, it is possible to increase the distances between the conductive layers, and therefore the thickness $d_i$ of the insulation layers. Therefore, the capacitor structure has the additional advantage that in principle any desired potential distribution can be achieved by varying the thicknesses $d_i$ and $d_m$ of the stack structure.

In a preferred embodiment, silicon oxide or silicon nitride is used as the insulation coating of the trench walls. As a result, the walls of the trench retain their original form while the layer is being built up, if the semiconductor is silicon.

In a further embodiment, the capacitor structure is embedded in a lightly doped semiconductor body region of a power semiconductor component. The semiconductor body region is located on a highly doped substrate of the same or opposite conduction type. As a result, charge carriers as counter-charges are made available by the capacitor structure to the charge carriers in the lightly doped semiconductor body region. As a result, the breakdown voltage of the component rises or the area-specific on resistance drops.

When a trench is being produced, it is difficult to accurately maintain the desired depth of the trench. It is therefore advantageous for the thickness of the lightly doped semiconductor body region to be greater than the depth of the trench in which the capacitor structure is located. This produces a buffer layer between the capacitor structure and the highly doped substrate, thereby simplifying production of the trench.

A further aspect of the invention relates to a semiconductor component which includes the capacitor structure. The capacitor structure makes it possible to increase the doping concentration in the lightly doped semiconductor body region without lowering the breakdown voltage.

The semiconductor components are preferably a Schottky diode, a PN or NP diode, a MOS power transistor or an IGBT power transistor. It is desirable for these components to have a particularly good breakdown strength with a high conductivity and therefore a low forward resistance.

The invention also relates to a process for producing structures in a semiconductor zone. First of all, a trench is produced in a semiconductor zone. This trench can be produced, for example, in a semiconductor wafer by suitable etching techniques, for example by chemical dry etching using reactive gas, and with the aid of suitable masks.

The trench is filled with a photoresist which changes chemically when exposed using ion beams. It is possible to use both photoresist which forms a positive resist and photoresist which forms negative resist. Examples of the resists include COP (polyglycidyl methacrylate coethyl acrylate), PMMA (polymethyl methacrylate) and TBS (polybutene sulfone).

The photoresist is exposed using ion beams and then developed. During the exposing using ion beams, the energy density, the ion type and the ion dose are set in such a way that the photoresist is only chemically changed at the defined depths, as a result of crosslinking of chain molecules taking place when using negative resists and crosslinked molecules being dissolved in the case of positive resists. Two regions result after the exposure step. In the first region, the photoresist has been chemically changed by the ion beams at the defined depth, and in the second region the photoresist remains chemically unchanged. It is preferable for the entire semiconductor wafer, not just the trench, to be exposed. During the subsequent developing of the photoresist, the photoresist is removed in precisely one of the two regions. The process described makes it possible to pattern the photoresist in the vertical direction.

FIG. 1 illustrates the physical effect which is exploited for the process. This figure shows the energy loss of an ion beam when the beam penetrates into a resist against the position. The unit for the energy loss is eV/Angstrom. If the ion which is introduced is protons, for example, large numbers of electrons are produced along the trajectory (curve) of the ion introduced. The ion beam acts as a source of electrons of sufficient energy.

The number of ions produced, or the energy deposited in the solid as a result of the ionization, is not constant along the ion trajectory. The ions, which in FIG. 1 are hydrogen ions, all have the same, defined starting energy. The further the ion beam penetrates into the material, the greater its energy loss becomes. With a starting energy of 1.5 MeV, the energy loss is 3 eV/Angstrom at the surface, 3.8 eV/Angstrom at half the penetration depth, namely 17 µm, and reaches its maximum, at 10.5 eV/Angstrom, at the penetration depth of 34 µm.

The photoresist is chemically changed only at the locations at which the energy loss of the ion is greater than a defined switching threshold, in this case approximately 8 eV per Angstrom. Therefore, in the example shown in FIG. 1, the photoresist is chemically changed only in a depth range from approximately 30 to 36 µm, whereas it remains unchanged in the other regions.

The following applies for other starting energies of the ions: with 1 MeV, the penetration depth is 17.6 µm and the energy loss is 3.8 eV/Angstrom at the surface, 5 at half the penetration depth and 11 eV/Angstrom at the penetration depth. In the case of a starting energy of 0.5 MeV, the penetration depth is 6.2 µm and the corresponding energy losses are 6 eV/Angstrom, 7.5 eV/Angstrom and 11 eV/Angstrom.

It can be seen from the numerical data given above that, with a starting energy of 1 MeV, the energy deposited at the surface is approximately half the energy deposited at the mean penetration depth. If the implanted ion dose is designed in such a way that the condition for reproducible developing is just satisfied, i.e. the degree of crosslinking of the resist is just sufficient, half the deposited energy required to effect a chemical reaction of the resist is still missing at the surface of the resist.

It is therefore possible to produce vertical cavities in the resist. The vertical position of these cavities is dependent only on the ion energy. The height of the cavities is dependent on the longitudinal scatter range and therefore on the type of ion used, the ion energy and the sensitivity of resist and developer. At higher ion energies and correspondingly higher penetration depths, the ratio of energy availability close to the surface and energy deposition in the depth becomes even more favorable. Examples of types of ions include hydrogen ions, helium ions and argon ions.

It is known from the prior art that the ion dose for hydrogen ions of 1.8 MeV in the case of PMMA should suitably be selected to be between $3*10^{13}$ cm$^{-2}$ and $1*10^{14}$ cm$^{-2}$. It can be assumed that for a significantly lower penetration depth, the required dose can be considerably reduced, since the introduction of energy is significantly more effective at low energies than at high energies.

In a first embodiment of the invention, the type of ion, the ion energy and the sensitivity of resist and developer are selected in such a way that the region which has been removed after the developing step extends from the surface down to a defined depth and the region which remains after the developing step extends from this defined depth down to the base of the trench. For this purpose, by way of example, a very sensitive resist is selected. Therefore, after the developing step, a plug of resist has been produced in the trench.

In conventional processes for producing a plug of resist in trenches, the resist is exposed using conventional exposure, such as light, and then etched. By contrast, in the process according to the invention, it is advantageous that the vertical position of the resist which remains after the developing step varies less as a result of process fluctuations, and the residual roughness is lower than when using conventional etchback processes. It is expected that the position of a surface of the resist which remains in the trench will fluctuate by no more than ±70 nm if its nominal position is at 2 µm. Exposure using ion beams is very accurate in particular with regard to the accuracy of the desired depth of action set, and in particular with regard to other known processes.

In a further embodiment, during the exposure using ion beams, the type of ions, ion energy and the sensitivity of resist and developer are set in such a way that the top edge of the region which is removed after developing lies below the top edge of the trench. The top edge of the trench is at the same height as the surface of the semiconductor zone. In this context, use is made of the above-described effect whereby with certain combinations of ion type, ion energy and the sensitivity of resist and developer, the resist is chemically changed only at depths which lie below the top edge of the trench. The process allows cavities to be produced in the trench after the developing step, above which cavities there are resist-filled regions.

If the exposure using ion beams is carried out in a plurality of exposure steps, and the exposure steps differ with regard to energy density and ion dose, this has the advantage that it is possible for a plurality of regions which lie at different depths to be exposed in succession. It is thus possible to produce a plurality of horizontal cavities at different depths. The developing step can then be carried out after the various exposure steps have taken place. This reduces the number of developing steps, which lowers the complexity of the process.

If, on the other hand, a step of developing the photoresist is carried out after each exposure step with different energy densities or ion doses, it is possible for the processes of the developing steps to be better matched to the preceding exposure steps.

In a preferred embodiment of the invention, the photoresist is sensitive both to ion radiation and to one of the conventional exposures, such as light, electrons or X-radiation. By way of example, the abovementioned resists COP and PMMA react to ion beams and to electron beams. After the trench has been filled with photoresist, a hard mask is applied to the semiconductor zone and the trench which has been filled with photoresist. The hard mask has openings, through which the zones located beneath the openings are chemically changed during the irradiation with the conventional exposure. If the conventional exposure is carried out, for example, using light, the hard mask consists, for example, of a layer of metal. The exposing of the photoresist using ion beams is then carried out, followed by exposing using conventional exposure, in particular light, X-radiation or electrons. The first region now comprises the zones which have been exposed at the defined depths by the ion beams and the zones which have been affected by the conventional exposure. During the subsequent developing, the first or second region is removed, depending on whether the resist is a positive or negative resist.

It is possible for a sacrificial layer to be applied to the inner sides of the trench before the trench is filled with photoresist. After the developing of the photoresist, the sacrificial layer has been uncovered where the adjoining photoresist has been removed. During a subsequent wet-chemical etch, the uncovered regions of the sacrificial layer are etched away, while the regions of the sacrificial layer which have not been uncovered remain in place. This has the resulting advantage that a sacrificial layer can likewise be vertically patterned. The patterning of the sacrificial layer can in turn be used to pattern other layers.

In a particularly preferred embodiment of the invention, after the trench has been produced, a layer sequence comprising oxide, metal and a masking layer is applied to the inner side of the trench. If the semiconductor is silicon, the oxide can be produced by oxidizing the silicon to form silicon dioxide. The metal and the masking layer can be applied, for example, by CVD (chemical vapor deposition). CVD has the advantage over sputtering that higher deposition rates are possible, allowing production costs to be reduced and conformal deposition to be achieved.

After the abovementioned layer sequence has been applied, the trench is filled with the photoresist and the photoresist is exposed using ion beams. This is followed by exposure using conventional exposure. After the resist has been developed, the masking layer is not covered by the photoresist at some locations. At these locations which are not covered, the masking layer is selectively removed by etching. Then, the metal is removed at the locations at which the masking layer has been removed in the previous step. Then, the hard mask and the masking layer are removed and a dielectric material is deposited in the trench. The metallic regions which are separated from one another are therefore insulated from one another by the dielectric material. The result is a stack of electrically conducting regions which ensures that the capacitance of the capacitor structure is higher than that of a trench of the same size filled with the dielectric material alone.

If, after the dielectric material has been deposited in the trench, the center of the trench, which remains clear, is filled with an oxide or imide, moisture is prevented from penetrating into the trench.

The invention makes use of the fact that implanted ions preferentially deposit their kinetic energy at the end of the exposed region (the end of range region) in the target material, in order to vertically pattern the resists, for example in deep trenches.

BRIEF DESCRIPTION OF THE DRAWINGS

The invention is explained in more detail in the drawings on the basis of exemplary embodiments. In the drawings.

DETAILED DESCRIPTION

Figure 1:
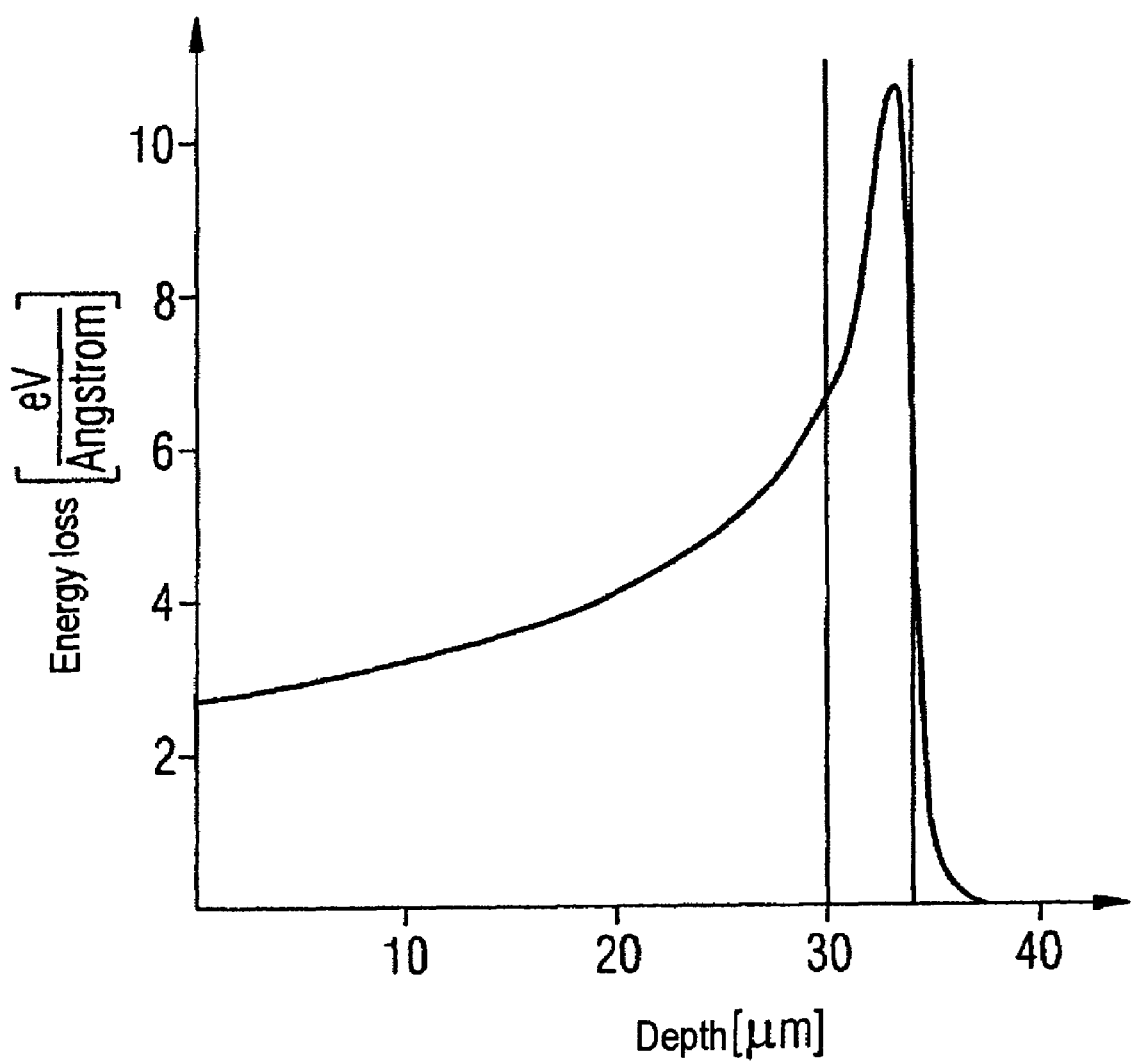
FIG. 1 shows the energy loss of an ion beam as a function of the location to illustrate the physical effect which is exploited.

The starting point in the text which follows for describing the exemplary embodiment is a situation which results from FIG. 1 as described above. This figure is not described again at this point, for the sake of simplicity.

Figure 2:
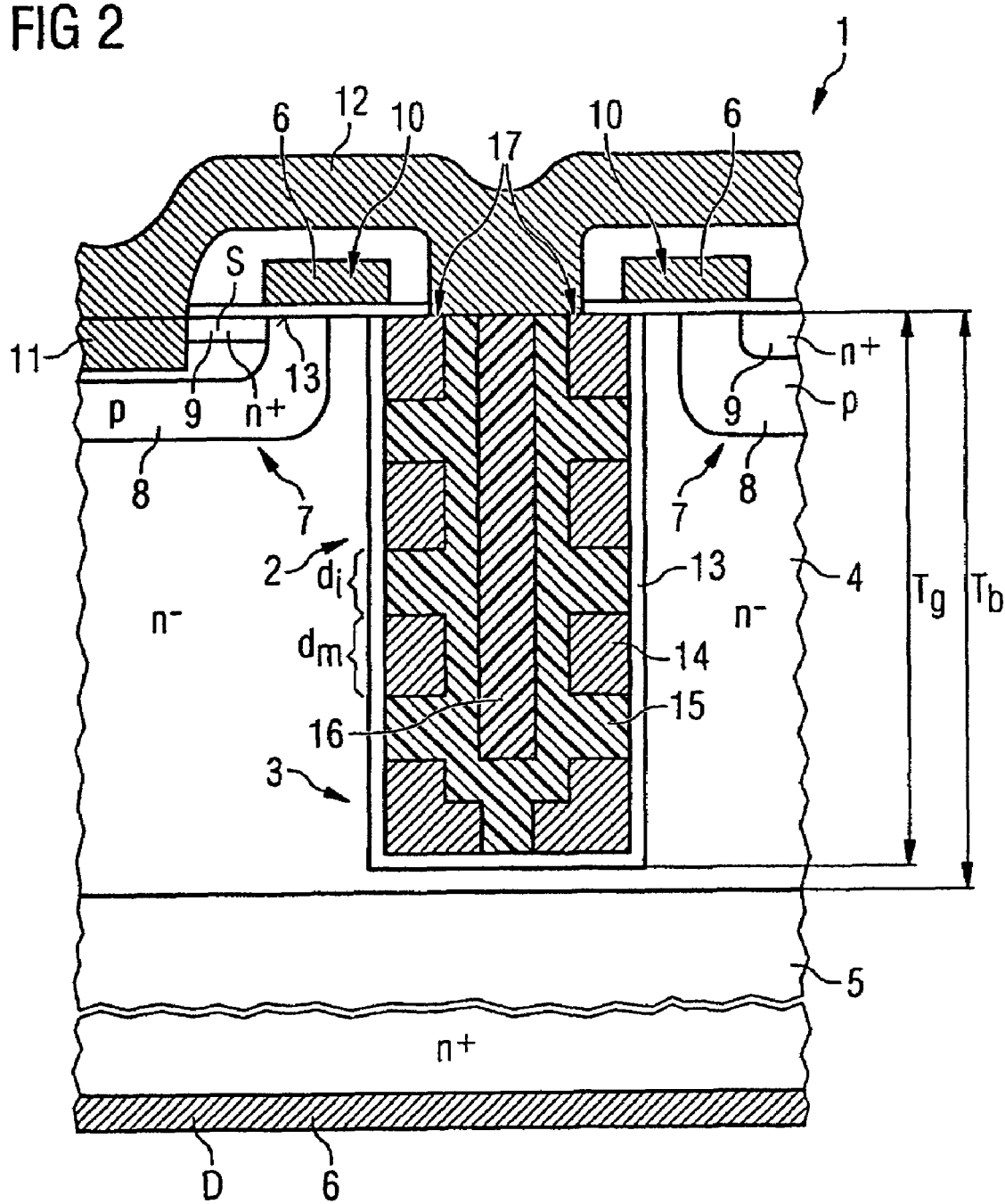
FIG. 2 shows a semiconductor component with a trench in which a capacitor structure according to the invention is located.

FIG. 2 shows a semiconductor component 1 with a trench 2 in which a capacitor structure 3 has been introduced. The semiconductor component 1 is a vertical power transistor which includes a drift zone 4 that consists of $n^-$-doped semiconductor material and has a depth $T_b$. A drain zone 5 of $n^+$-doped material with a metal drain electrode 6 is arranged below the drift zone 4. MOS structures 7 are located above the drift zone 4. These MOS structures include p-doped body zones 8, source zones 9 and gates 10. The source zones are connected to the metallic source electrode 12 by means of a metallic source contact. When a voltage which is higher than the threshold voltage of the semiconductor component 1 is applied, conducting channels 13 are formed in the body zones between the source zones and the drift zone, causing current to flow from the source electrode to the drain electrode.

In the semiconductor component 1, the trench 2 is also located in the drift zone 4. It includes an insulation coating 13 and islands of conducting material 14 along the trench walls. The islands are separated from the drift zone 4 by the insulation coating 13. The islands have a thickness $d_m$. The capacitor structure 3 also includes a dielectric 15 between the islands and a native oxide 16 in the center of the trench 2. The width of the dielectric between two islands is denoted by $d_i$. The top islands are electrically conductively connected to the source electrode 12 at the connection location 17.

In the off situation, the capacitor structure makes counter-charges available in the trench to the charge carriers in the drift zone 4. This reduces the risk of avalanche breakdown. The islands of metallic regions 14 reduce the effective thickness of the dielectric 15 and therefore increase the capacitance of the capacitor structure.

Figure 3A:
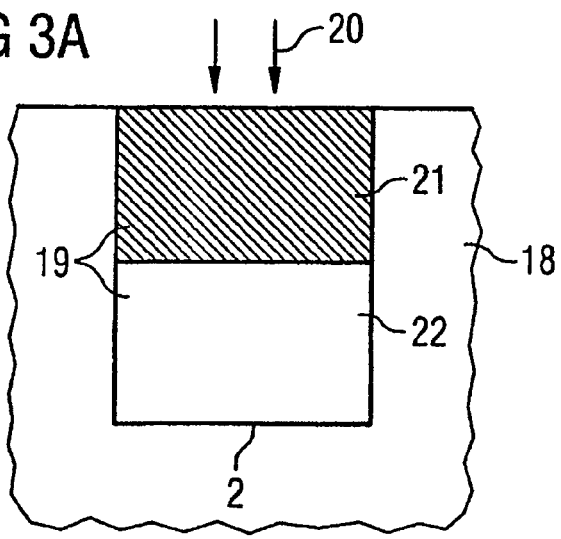
FIGS. 3A and 3B show an exemplary embodiment of the process in which a structure has been produced in accordance with the invention in a trench.
Figure 3B:
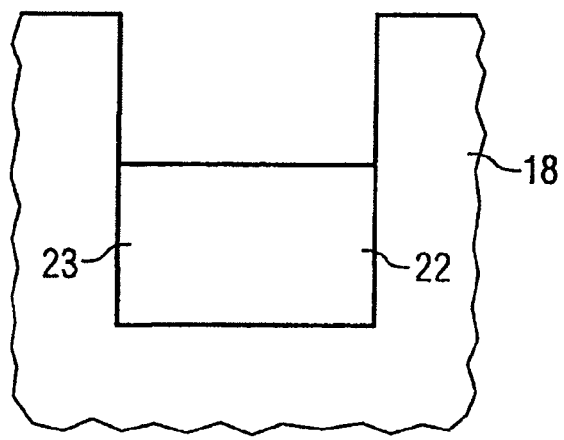

FIGS. 3A and 3B illustrate the process according to the invention in a first exemplary embodiment. FIG. 3A shows a trench 2 in semiconductor zone 18 which has been filled with a photoresist 19. The ion radiation 20 produces a first region 21, in which the photoresist has been changed, whereas the photoresist remains unchanged in the second region 22. FIG. 3B shows the same trench after the developing step. In this step, the photoresist has been removed from the first region 21. A resist plug 23 remains in the second region 22.

Figure 4:
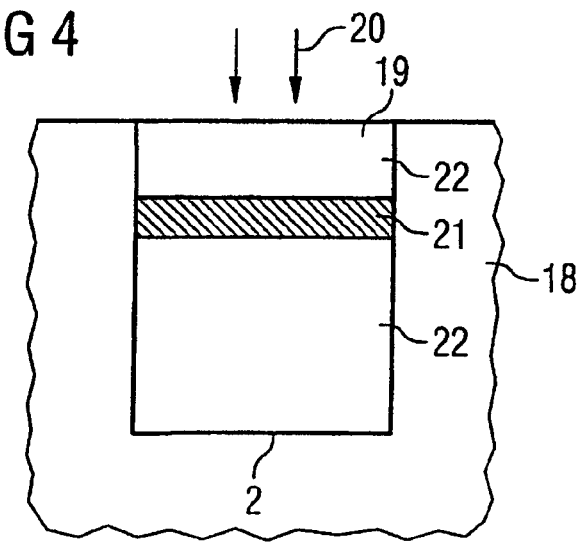
FIG. 4 shows a step of a second exemplary embodiment of the process according to the invention for patterning a trench (shown in section here) which is located in a semiconductor zone.

FIG. 4 shows a semiconductor zone 18 with a trench 2 in section. The trench 2 has been filled with a photoresist 19. Ions are introduced from above by means of an ion beam 20. A first region 21, in which the photoresist is chemically changed by the ion implantation, is formed at a defined depth, whereas a second region 22 remains chemically unchanged. During subsequent developing, one of the two regions is removed. In a structure as shown in FIG. 4, the developer medium does not have to be introduced from above, but rather can be introduced from the side.

Figure 5A:
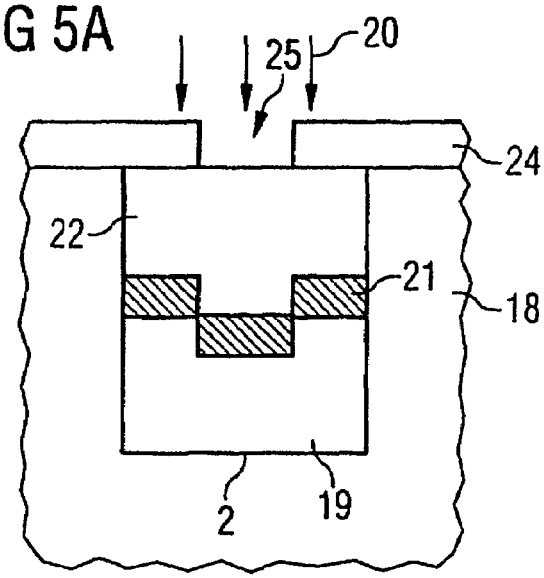
FIGS. 5A to 5C show, in a third exemplary embodiment, process steps used to pattern the semiconductor component.
Figure 5B:
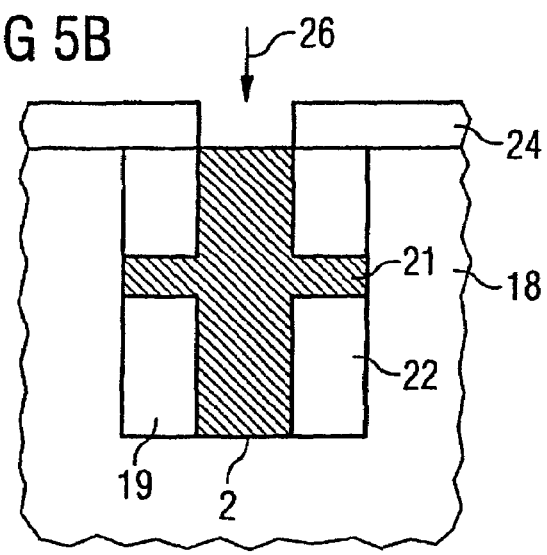
Figure 5C:
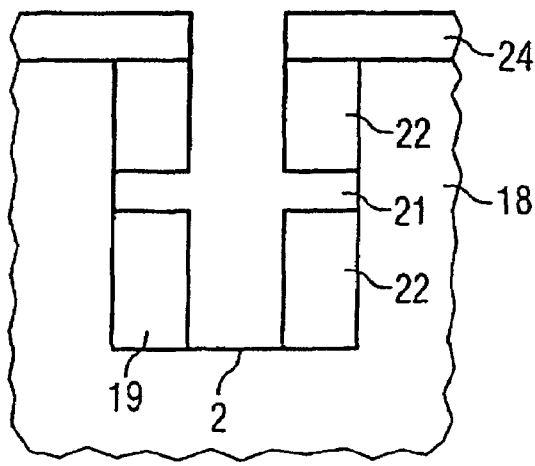

FIGS. 5A to 5C show a process for patterning trenches in a semiconductor zone in a third exemplary embodiment.

In FIG. 5A, a trench 2 has been etched into a semiconductor zone 18. The trench 2 has been filled with photoresist 19. A hard mask 24 has been applied above the semiconductor zone 18 and the photoresist 19. This hard mask 24 includes an opening 25 in the center of the trench 2. Ions 24 are implanted from above. This produces the first region 21, in which the photoresist has been chemically changed, while the photoresist remains unchanged in the second region 22. Zones of the second region 22 which lie below the hard mask 24 are at a higher level than the zones below the opening 25. This is because the ions are already losing energy in the hard mask 24.

FIG. 5B shows the next process step, in which radiation 26 acts on the trench 2 from above. This radiation 26 comprises UV light. The radiation 26 chemically changes the photoresist below the opening 25, so that the second region 22 has been increased in size compared to FIG. 5A.

FIG. 5C shows the trench after the developing step. The photoresist 19 from the first region 21 has been removed after the developing, whereas the photoresist 19 in the second region 22 remains in place.

Figure 6:
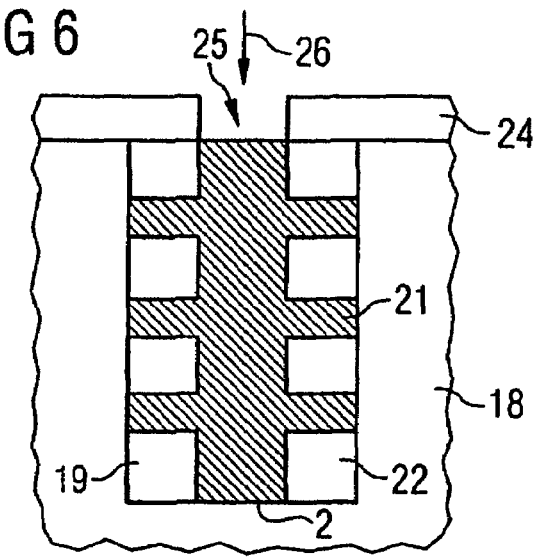
FIG. 6 shows, in a fourth exemplary embodiment, a structure in a trench which has been multiply vertically patterned by the process.

FIG. 6 shows, in a fourth exemplary embodiment of the process, a trench 2 in a semiconductor zone 18, into which photoresist 19 has been introduced. A hard mask 24 with an opening 25 has been applied above the semiconductor zone 18 and the photoresist 19. Ions have been implanted into the photoresist a number of times. The energy of the ions has been changed during the different implantation steps, with the result that the different steps produced different penetration depths of the ion beams. As a result, the second region 22 includes a plurality of horizontal strips. This is then followed by exposure 26 from above using UV light. The zone below the opening 25 in the hard mask 26 is likewise chemically changed and therefore also forms part of the second region 22.

Figure 7A:
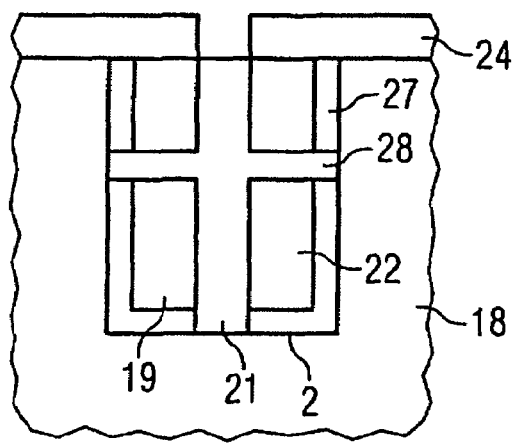
FIGS. 7A and 7B show, in a fifth exemplary embodiment, a multiply vertically patterned semiconductor component produced by the process according to the invention.
Figure 7B:
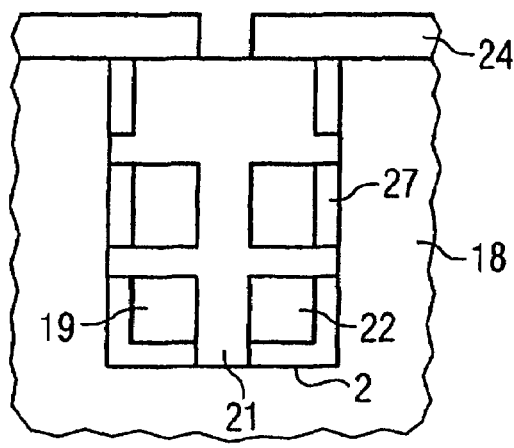

FIGS. 7A to 7B show a fifth process for patterning semiconductor zones involving multiple implantation and multiple developing. In FIG. 7A, a trench 2 has been introduced into a semiconductor zone 18. FIG. 7A differs from FIG. 5C by virtue of the fact that a sacrificial layer 27 has been applied to the inner sides of this trench 2 before the trench 2 was filled with photoresist 19. The photoresist 19 was exposed using ion beams and conventional exposure and then developed. The photoresist 19 from the second region 22 was removed as a result. This was followed by a wet-chemical etch, in which uncovered zones 28 of the sacrificial layer 27 were etched away.

FIG. 7B shows the trench 2 after further process steps. A further ion implantation has been carried out. This ion implantation took place using ions with a higher energy and therefore a greater penetration depth. Developing in turn removed the chemically changed region, with the result that after a wet-chemical etch the sacrificial layer has likewise been removed at the lower location. On account of the fact that the vertical uncovered regions are removed in succession by developing or etching, a lower ion energy is required for the implantation of the ions in the lower regions of the photoresist than if the upper regions had not yet been uncovered. This is because the ion beams lose much less energy in the regions which have already been uncovered than in the photoresist.

Figure 8A:
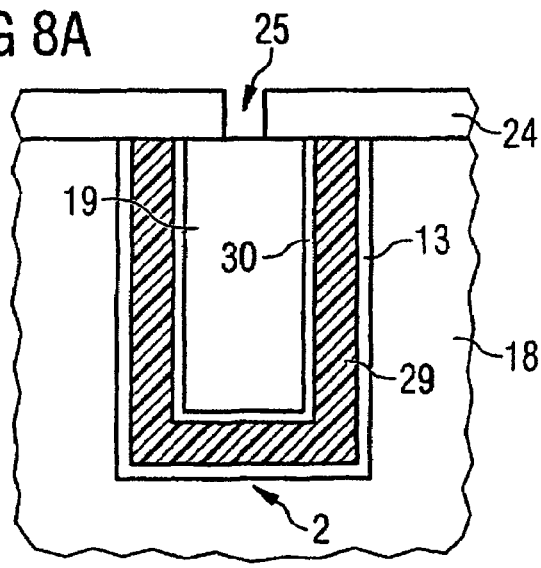
FIGS. 8A to 8F show the main process steps according to the invention used to produce a capacitor structure in a trench which is located in a semiconductor zone.

FIGS. 8A to 8F show a process sequence used to fabricate a capacitor structure in a trench in a semiconductor zone. FIG. 8A shows a trench 2 in a semiconductor zone 18. The insulation coating 13 of oxide, a metal 29 and a hard mask 30 have been successively applied to the inner sides in the trench 2. These layers can be deposited in a conventional way, for example by CVD. Then, the trench is filled with a photoresist 19.

An upper hard mask 24 with an opening 25 is deposited above the photoresist 19 and the semiconductor zone 18.

Figure 8B:
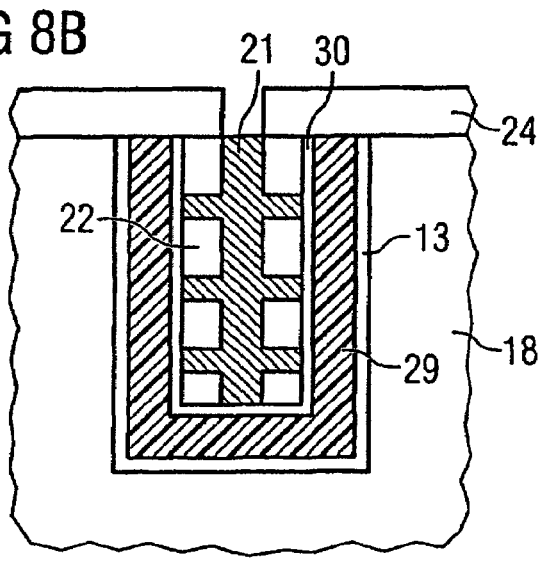

FIG. 8B shows the trench 2 after exposing using ion beams and conventional exposure. The photoresist has been chemically changed in the second region 22. The first region 21 contains the photoresist 19 which has not been chemically changed.

Figure 8C:
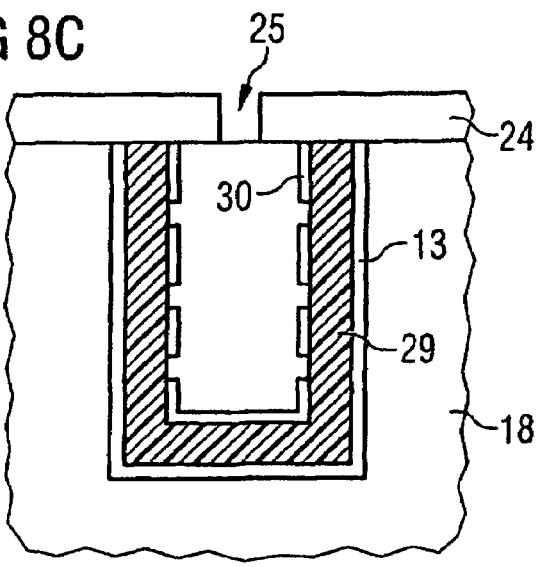

FIG. 8C shows the trench after the selective etching of the hard mask 30. First of all, the photoresist 19 was developed, then the photoresist 19 was removed from the second region 22. This was followed by a wet-chemical etch, as a result of which regions of the hard mask 30 which had been uncovered by the developing were etched away. This was followed by removal of the photoresist 19 in the second region 21.

Figure 8D:
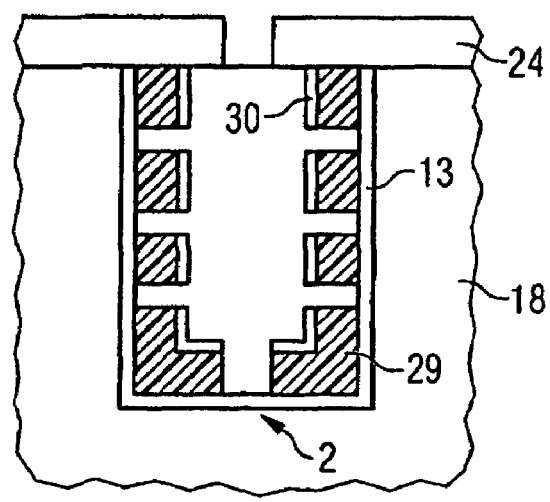

FIG. 8D shows the trench 2 after a further etching step, in which those regions of the metal 29 which are not covered by the hard mask 30 have been selectively etched away.

Figure 8E:
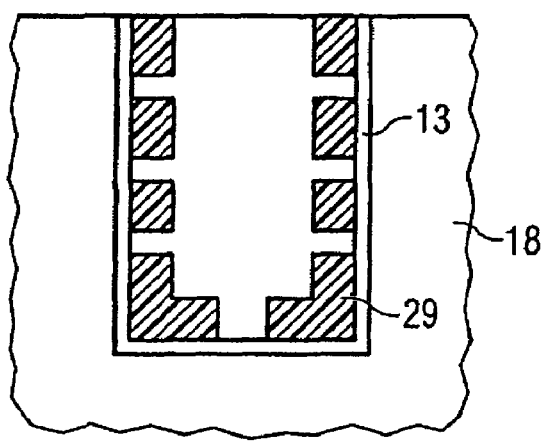

FIG. 8E shows the trench 2 after the hard masks 30 and 24 have been removed.

Figure 8F:
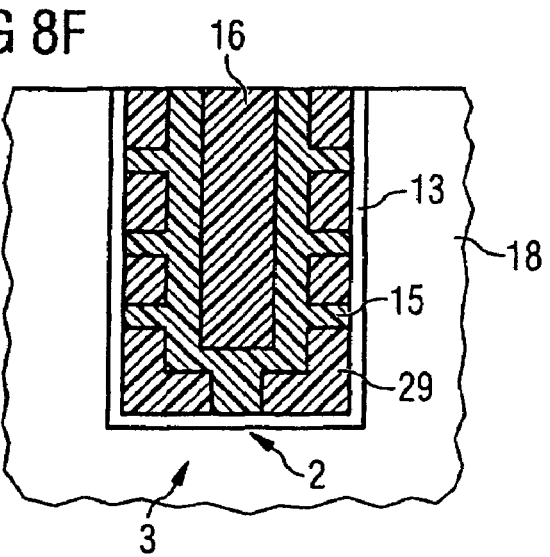

FIG. 8F shows the trench 2 after a dielectric 15 has been deposited in the trench. The dielectric 15 insulates the islands of metallic regions 29 from one another. Finally, the inner region of the trench 2, which has been left uncovered, is filled with an imide or oxide 16. The capacitor structure 3 which is formed as shown in FIG. 8F corresponds to the capacitor structure in the power transistor as shown in FIG. 2.

What is claimed is:

1. A capacitor structure, comprising:
    a trench formed in a semiconductor material extending from an upper surface of the semiconductor material into the semiconductor material;
    a first columnar arrangement of conductive islands arranged in the trench one above the other adjacent an inner wall of the trench;
    a second columnar arrangement of conductive islands arranged in the trench one above the other adjacent a different inner wall of the trench;
    an insulation coating interposed between the inner walls of the trench and the conductive islands; and
    at least one insulating material interposed between adjacent ones of the conductive islands of the same columnar arrangement and between the different columnar arrangements so that each conductive island is conductively isolated and physically separated from the other conductive islands in the same columnar arrangement and from the conductive islands in the other columnar arrangement, wherein each of the conductive islands is positioned entirely within the trench below the upper surface of the semiconductor material.

2. A capacitor structure according to claim 1, wherein a vertical center of the trench is filled with imide or oxide.

3. A capacitor structure according to claim 1, wherein the insulating material has a higher relative permittivity than silicon dioxide.

4. A capacitor structure according to claim 1, wherein a thickness of the conductive islands and/or of the insulating material in a region between the conductive islands varies according to a predetermined potential distribution.

5. A capacitor structure according to claim 1, wherein the insulation coating contains $SiO_2$ and/or $Si_3N_4$.

6. A capacitor structure according to claim 1, wherein the semiconductor material is lightly doped of one conduction type and arranged on a highly doped substrate of the same or opposite conduction type.

7. A capacitor structure according to claim 6, wherein a thickness of the semiconductor material is greater than a depth of the trench so that the semiconductor material is arranged between a bottom of the trench and the highly doped substrate.

8. A capacitor structure according to claim 7, wherein the semiconductor material forms a layer between the bottom of the trench and the highly doped substrate.

9. A semiconductor component comprising the capacitor structure according to claim 1.

10. A semiconductor component according to claim 9, which is a Schottky diode, a PN or NP diode, a MOS power transistor or an IGBT power transistor.

11. A capacitor structure, comprising:
 a trench formed in a semiconductor material extending from an upper surface of the semiconductor material into the semiconductor material;
 a first columnar arrangement of conductive islands arranged in the trench one above the other adjacent an inner wall of the trench;
 a second columnar arrangement of conductive islands arranged in the trench one above the other adjacent a different inner wall of the trench;
 an insulation coating interposed between the inner walls of the trench and the conductive islands;
 at least one insulating material interposed between adjacent ones of the conductive islands of the same columnar arrangement and between the different columnar arrangements so that each conductive island is conductively isolated and physically separated from the other conductive islands in the same columnar arrangement and from the conductive islands in the other columnar arrangement;
 wherein each of the conductive islands is positioned entirely within the trench below the upper surface of the semiconductor material; and
 wherein a vertical center of the trench is filled with imide or oxide, the insulating material has a higher relative permittivity than silicon dioxide and a thickness of the conductive islands and/or of the insulating material in a region between the conductive islands varies according to a predetermined potential distribution.

12. A capacitor structure according to claim 11, wherein the semiconductor material is lightly doped of one conduction type and arranged on a highly doped substrate of the same or opposite conduction type.

13. A capacitor structure according to claim 12, wherein a thickness of the semiconductor material is greater than a depth of the trench so that the semiconductor material is arranged between a bottom of the trench and the highly doped substrate.

14. A capacitor structure according to claim 13, wherein the semiconductor material forms a layer between the bottom of the trench and the highly doped substrate.

\* \* \* \* \*